United States Patent [19]

Koga

[11] Patent Number: 4,684,923

[45] Date of Patent: Aug. 4, 1987

[54] ENCODER WITH SELECTIVE INDICATION OF COMPRESSION ENCODING AND DECODER THEREFOR

[75] Inventor: Toshio Koga, Tokyo, Japan

[73] Assignee: NEC Corporation, Japan

[21] Appl. No.: 774,648

[22] Filed: Sep. 11, 1985

[30] Foreign Application Priority Data

Sep. 17, 1984 [JP] Japan ................................. 59-194108
Sep. 17, 1984 [JP] Japan ................................. 59-194109
Sep. 28, 1984 [JP] Japan ................................. 59-203223
Sep. 28, 1984 [JP] Japan ................................. 59-203224

[51] Int. Cl.$^4$ ............................................. H03M 7/48
[52] U.S. Cl. ............................... 340/347 DD; 358/261
[58] Field of Search ................ 340/347 DD; 235/310; 358/260, 261; 382/56

[56] References Cited

U.S. PATENT DOCUMENTS

| | | | |
|---|---|---|---|
| 2,978,535 | 4/1961 | Brown | 358/261 |
| 4,070,694 | 1/1978 | Sakamoto | 358/261 |
| 4,533,957 | 8/1985 | Iinuma | 358/261 |

*Primary Examiner*—Charles D. Miller
*Attorney, Agent, or Firm*—Ostrolenk, Faber, Gerb & Soffen

[57] ABSTRACT

On encoding a cluster and run sequence comprising clusters of non-zero signal elements and runs of zero signal elements into a code sequence with application of a compression encoding scheme selectively to the clusters and without application of the encoding scheme to the runs, a mode code is used to indicate application of the encoding scheme to each selected cluster and to represent a zero signal element next preceding the selected cluster in a next preceding run. In the code sequence, the mode code next precedes a succession of amplitude codes representative of the selected cluster and next succeeds a run length code preferably representative of that run length of the next preceding run from which the next preceding zero signal element is reduced. Alternatively, the mode code may indicate switching between application and non-application of the encoding scheme to partial sequences each of which starts with a cluster next succeeded by a run. In either event, a particular code is preferably used to indicate an end of each run. On decoding, the mode code is detected preferably with reference to the particular code to decide whether or not each amplitude code succession should be decoded according to an expansion decoding scheme which corresponds to the encoding scheme.

20 Claims, 6 Drawing Figures

ENCODER WITH SELECTIVE INDICATION OF COMPRESSION ENCODING AND DECODER THEREFOR

BACKGROUND OF THE INVENTION

This invention relates to an encoder for encoding a signal element sequence into a code sequence to which a compression encoding scheme is selectively applied and to a decoder for decoding the code sequence into a reproduction of the signal element sequence to which an expansion decoding scheme which corresponds to the compression encoding scheme is selectively applied.

An original sequence of signal elements, such as pels or picture elements, are encoded into a sequence of codes either for transmittal through a transmission medium or recordation on a recording medium. Generally signal compression is applied to reduce the amount of information in the code sequence. The original sequence is encoded into the code sequence usually in two steps. In a first step, the original sequence is encoded into a redundancy reduced sequence of various signal elements. In a second step, the redundancy reduced sequence is encoded into the code sequence.

Various techniques are already known for use in carrying out the first step. By way of example, predictive encoding is described in an article contributed by J. C. Candy et al. to BSTJ, Vol. 50, No. 6 (July–August 1971), pages 1889 to 1917, under the title of "Transmitting Television as Clusters of Frame-to-Frame Differences." Orthogonal transformation is described in another article contributed by Wen-Hsiung Chen et al to IEEE Transactions on Communications, Vol. COM-25, No. 11 (November 1977), pages 1285 to 1292, and entitled "Adaptive Coding of Monochrome and Color Images." The second step is carried out typically by Huffman encoding.

In the redundancy reduced sequence, the signal elements comprise clusters of significant or information bearing signal elements and runs of insignificant or background signal elements. The clusters and runs are arranged to follow one another in an alternating fashion. The significant signal elements have various finite or significant amplitudes or levels and may include or be constructed of predictive errors and orthogonal transform coefficients used in the predictive encoding and in the orthogonal transformation. The insignificant signal elements, as herein called, represent background data for the significant signal elements and have a substantially constant amplitude or a zero level amplitude or a black level. Briefly speaking, the redundancy reduced sequence has a statistical characteristic of concentating at the insignificant signal elements.

As known in the art, the runs have run lengths, respectively. On producing the code sequence, each run is encoded into a run length code representative of the run length of the run under consideration. Each cluster is encoded into a succession of significant codes representative of the respective significant signal elements of the cluster in question.

The redundancy reduced sequence is encoded into such a code sequence with selective application of a compression encoding scheme to the significant signal elements of the clusters. In relation to the compression encoding scheme, the significant signal elements of some of the clusters are subsampled into subsamples leave remaining signal elements. The remaining signal elements or subsamples are encoded into a reduced number of significant codes in the code sequence.

Inasmuch as the compression encoding scheme is selectively applied to the clusters, application and non-application of the compression encoding scheme must be indicated in the code sequence by a certain code which may be called a mode code. The signal element sequence is generally divisible into a plurality of subsequences, such as scanning lines used in television or facsimile. If the mode code were used only once for each subsequence as in "subsample mode" and "subline mode" described in an article contributed by Hiroshi Yasuda et al to IEEE Transactions on Communications, Vol. COM-25, No. 5 (May 1977), pages 508 to 516, under the title of "Transmitting 4-MHz TV Signals by Combinational Difference Coding," the code sequence could be subjected to only a negligible increase in the amount of information. The mode codes would, however, have to be used for each cluster so as to indicate whether or not the cluster under consideration is encoded with application of the compression encoding scheme. This gives rise to a considerable increase in the amount of information in the code sequence. Alternatively, application and non-application of the compression encoding scheme must separately be encoded. This requires an additional encoder and results in an increase in hardware.

SUMMARY OF THE INVENTION

It is therefore an object of the present invention to provide an encoder for encoding a signal element sequence with selective application of a compression encoding scheme into a code sequence which is subjected to a minimum possible increase in an amount of information.

It is another object of the present invention to provide an encoder of the type described, in which the increase in hardware necessary for providing the functions of the present invention is as little as possible.

It is a further object of this invention to provide a decoder for use as a counterpart of the encoder of the type described.

Other objects of this invention will become clear as the description proceeds.

According to this invention, there is provided an encoder for encoding an input sequence of various signal elements comprising clusters of significant signal elements and runs of insignificant signal elements with a cluster next succeeded by a run and with a run next succeeded by a cluster and which is for encoding the input sequence with application of a compression encoding scheme to the significant signal elements depending on the clusters and without application of the compression encoding scheme to the insignificant signal elements and comprises: mode signal producing means responsive to the input sequence for producing a mode signal selectively indicative of two modes with the two modes switched between a first and a second mode wherein the significant signal elements of each cluster should be encoded without and with application of the compression encoding scheme, respectively; first encoding means responsive to the mode signal for encoding one of the insignificant signal elements into a mode code that next precedes each cluster of the significant signal elements for which the two modes are switched between the first and the second modes; second encoding means coupled to the mode signal producing means for encoding each cluster into a succession of significant codes without and with application of the compression encoding scheme when the mode signal indicates the first and the second modes, respectively; and third encoding means for encoding each run into a run length code dependent on the run being encoded.

The invention further provides a decoder for decoding a received input sequence of various codes comprising successions of the significant codes, run length codes, and a mode code selectively interposed between one of the run length codes and one of the successions. The decoder comprises: detecting means responsive to the input sequence for detecting the mode code in a fundamental series of the run length code, the mode code, and a significant code of the successions to produce a mode signal selectively indicative of two modes with the two modes switched between a first and a second mode depending on detection of the mode code; first decoding means coupled to the detecting means for decoding each of the successions into a cluster of significant signal elements without and with application of an expansion decoding scheme when the mode signal indicates the first and the second modes, respectively; and second decoding means for detecting each run length code without application of the expansion decoding scheme into a run of at least zero insignificant signal element dependent on a run length represented by the run length code being decoded.

It should be noted in connection with the above that the encoder produces an output sequence of various codes in which each run length code may not necessarily represent an actual run length but may represent an adjusted run length which is one or two insignificant signal elements shorter than the actual run length. It is usual in the manner which will later be described that a run of a unit run length may be included in a cluster by a process known as "bridging" in the art. In any event, the run length code may represent a zero run length, namely, zero insignificant signal element.

DESCRIPTION OF THE PREFERRED EMBODIMENTS

Figure 1:
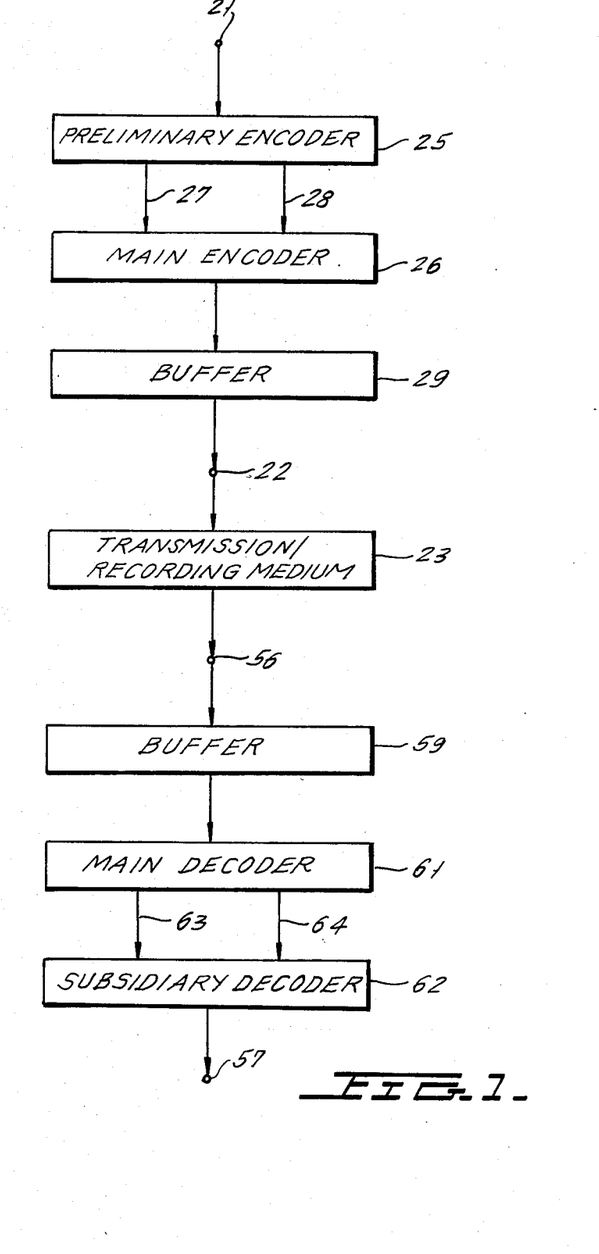
FIG. 1 is a block diagram of an encoding and a decoding circuit to which the instant invention is applied.

Referring to FIG. 1, there is described below an encoding circuit in accordance with the present invention. The encoding circuit has circuit input and output terminals 21 and 22. Input terminal 21 is supplied with an original signal sequence which is typically a picture signal. The encoding circuit delivers a compression encoded signal sequence to a transmission or a recording medium 23 through output terminal 22.

In the encoding circuit, a preliminary encoding device 25 is supplied with the original signal sequence from input terminal 21 and supplies a main encoding device 26 through a main connection 27 with a sequence of various signal elements arranged time sequentially along time instants which may be sampling instants. In the manner which will later be described in detail, the main encoding device 26 carries out a compression encoding scheme selectively on the signal element sequence. The "main" encoding device 26 is so named because attention is directed to the compression encoding scheme when this invention is applied to an encoding circuit. Responsive to the original signal sequence, the preliminary encoding device 25 furthermore supplies the main encoding device 26 through a control connection 28 with a mode signal which will presently be described.

The signal element sequence may be obtained either by the predictive encoding or by orthogonal transformation which were mentioned above. When predictive encoding is resorted to, the signal elements represent the prediction errors, respectively. When orthogonal transformation is used, the signal elements comprise transform coefficients, respectively. It is preferred that each signal element be a result of quantization of the prediction error or the transform coefficient with the number of quantization levels restricted for the prediction errors or the transform coefficients.

Responsive to the mode signal delivered through the control connection 28, the main encoding device 26 encodes the signal element sequence fed through the main connection 27 into a sequence of various codes and supplies the code sequence to a buffer memory 29. When a subsampling process is selectively applied as the compression encoding scheme in the manner which will shortly be described, the code sequence has interspersed quiescent time instants. At any rate, the buffer memory 29 carries out rate matching between rates at which the code sequence is fed thereto and at which the compression encoded signal sequence is used in the transmission or the recording medium 23. Depending on the circumstances, the compression encoded signal sequence may be referred to also as a sequence of various codes.

Figure 2:
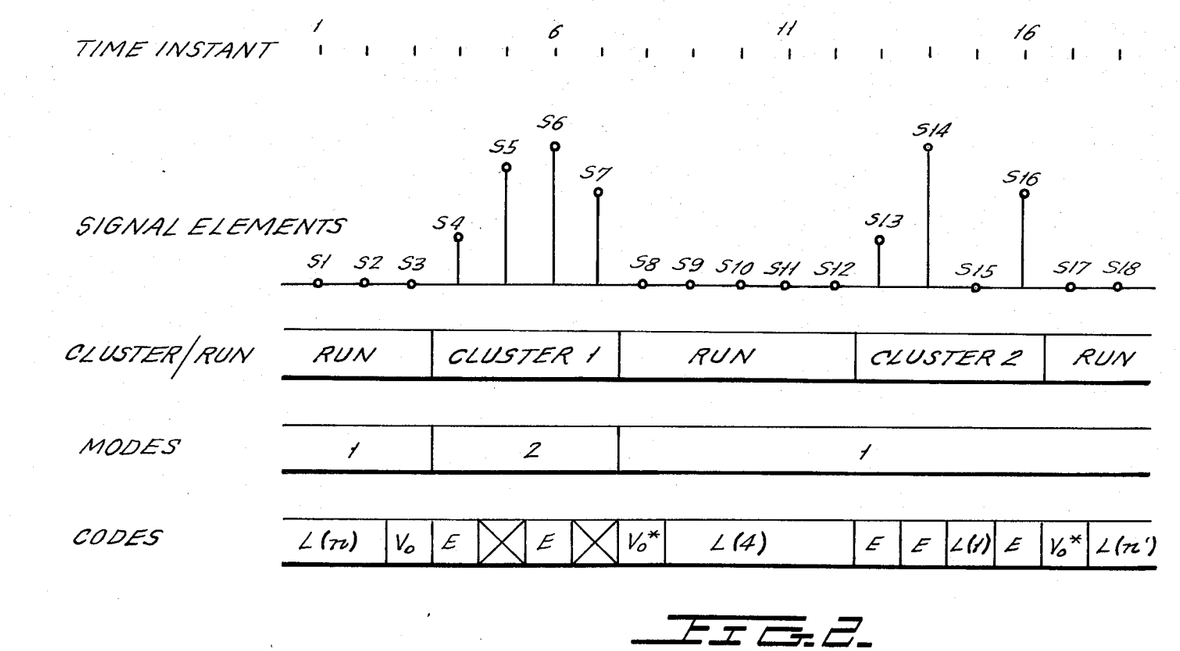
FIG. 2 is a schematic time chart for use in describing operation of an encoding and a decoding circuit according to an aspect of this invention.

Turning to FIG. 2, eighteen time instants are referred to as a first through eighteenth time instants depicted along a top or first line. It should be understood that other time instants precede the first time instant and further time instants follow the eighteenth time instant. The signal elements or samples are depicted along a second line. The signal elements positioned at the first through eighteenth time instants will be called first through eighteenth signal elements and designated by S1 through S18. In the example being illustrated, the first through the third signal element S1 to S3, the eighth through the twelfth signal elements S8 to S12, the fifteenth signal element S15, and the seventeenth and the eighteenth signal elements S17 and S18 have a zero amplitude and are referred to herein as insignificant or background signal elements. The fourth through the seventh signal elements S4 to S7, the thirteenth and the fourteenth signal elements S13 and S14, and the sixteenth signal element S1 have various finite or significant amplitudes or levels and are herein called significant or information bearing signal elements.

In the manner mentioned hereinabove, it is possible to regard an insignificant signal element as a significant signal element by a process knosn as "bridging" in the art when only one or very few insignificant signal elements are interposed between two significant signal elements. As for the process of bridging, reference should be had to the above-cited Candy et al article if desired. The signal element sequence therefore comprises a first and a second cluster of significant signal elements of the fourth through the seventh signal elements S4 to S7 and the thirteenth through the sixteenth signal elements S13 to S16, respectively. Each cluster is interposed between two runs of insignificant signal elements in the manner illustrated along a third line labelled "Cluster/Run." The run between the first and the second clusters consists of five insignificant signal elements S8 through S12 and has an actual run length of five signal elements. The run next preceding the first cluster, has a certain actual run length depending on the signal elements which precede the first signal element S1. This applies to another run that starts with the seventeenth signal element S17.

In FIG. 2, the first cluster consists of signal elements S4 through S7 of amplitudes which vary relatively smoothly with time. It is very convenient to apply the compression encoding scheme to such significant signal elements to compress the amount of informaion in the code sequence. The preliminary encoding device 25 (FIG. 1) is for locating a cluster of such significant signal elements and for delivering the mode signal to the control connection 28 to indicate whether or not the clusters should be encoded with application of the compression encoding scheme. It will be assumed merely for simplicity of description that the compression encoding scheme is the subsampling process according to a single predetermined rule, such as to leave those of the significant signal elements as remaining signal elements or subsamples and to delete those thereof as redundant signal elements which appear as odd-numbered and even-numbered significant signal elements in each cluster, respectively. The mode signal will be said to indicate a first and a second mode of operation when the compression encoding scheme should not and should be applied to the significant signal elements of the clusters. The compression encoding scheme is not applied to the runs. In other words, the runs are always subjected to the first mode of operation. The mode signal therefore indicates the first and the second modes in the manner depicted along a fourth line labelled "Modes."

It will now be understood that the mode signal selectively indicates a plurality of modes which are the first and the second modes in the example under consideration. The two modes are switched from the first mode to the second mode in response to each cluster, such as the first cluster, of the significant signal elements which should be encoded with application of the compression encoding scheme. The two modes are switched from the second mode to the first mode in response to each run that next succeeds a cluster of the significant signal elements encoded with application of the compression encoding scheme. The two modes are kept at the first mode in response to each cluster, such as the second cluster, of the significant signal elements which should be encoded without application of the compression encoding scheme.

In the manner which will presently be described in detail, the main encoding device 26 (FIG. 1) is controlled by the mode signal indicative of the second mode to encode only those of the significant signal elements of each cluster into a succession of significant codes which should not be deleted by the subsampling process of the predetermined rule but should be left as remaining signal elements or subsamples as they are. The significant codes represent the significant amplitudes of the respective remaining signal elements in such a succession. When the mode signal indicates the first mode, all significant signal elements of a cluster are encoded into a succession of significant codes representative of the significant amplitudes of the respective significant signal elements. The fourth, the sixth, the thirteenth and the fourteenth, and the sixteenth signal elements S4, S6, S13 and S14, and S16 are therefore encoded into the significant codes designated by E's in a fifth or bottom line labelled "Codes." The fifth and the seventh signal elements S5 and S7 are deleted as deleted signal elements are are not encoded in the manner indicated by crosses.

Although deemed as a significant signal element on defining or forming the clusters, the fifteenth signal element S15 is in fact a signal element of the zero amplitude and is encoded into a significant code which specifically represents the zero amplitude. It is surmised in the figure that the fifteenth signal element S15 is encoded into a run length code L(1) which represents the unit run length, namely, a run length of a single insignificant signal element.

One of the insignificant signal elements of the runs that next precedes each cluster of the significant signal elements which should be encoded with application of the compression encoding scheme, is encoded into a mode code which is depicted by Vo. The third signal element S3 is therefore encoded into the mode code Vo. In the example being illustrated, the mode code Vo represents an insignificant signal element and indicates switching of the two modes from the first mode to the second mode.

One of the insignificant signal elements of the runs that next succeeds each cluster, is encoded into a particular code Vo* irrespective of application and non-applicaion of the compression encoding scheme to the cluster. Each of the eighth and the seventeenth signal elements S8 and S17 is therefore encoded into the particular code Vo*. In the example under consideration, the particular code Vo* represents again an insignificant signal element and indicates that the particular code Vo* and the following codes should be processed in the first mode until the mode code Vo appears. For example, the particular code Vo* for the eighth signal element S8 indicates switching of the two modes from the second mode to the first mode. The particular code Vo* for the seventeenth signal element S17 indicates that the first mode should be kept unchanged.

The run that next precedes the first cluster, therefore has a beginning and an end at which the insignificant signal elements are encoded into the particular code Vo* (not shown) and the mode code Vo (for the third signal element S3), respectively. The run length becomes an adjusted run length which is two signal elements shorter than the actual run length. The run that lies between the first and the second clusters, has a beginning at which the insignificant signal element is encoded into the particular code Vo*. The run under consideration has an adjusted run length which is one signal element shorter than the actual run length, namely, is four signal elements long. It is understood that a run has an adjusted run length which is equal to the actual run length less two and one signal element when next succeeded and not succeeded by a cluster of the significant signal elements which should be encoded with and without application of the compression encoding scheme, respectively.

The runs are encoded into run length codes, respectively, which represent the adjusted run lengths and are dependent on the actual run lengths. The run length code for the run which next precedes the first cluster, is depicted as L(n) where n is equal to the actual run length less two signal elements. The run between the first and the second clusters is encoded into a run length code L(4). The run length code for the run next succeeding the second cluster, is shown as L(n') where n' represents the adjusted run length which is one or two signal elements shorter than the actual run length depending on the circumstances.

It is preferred that the particular code Vo* should have a predetermined code pattern which can readily be distinguished in a series of a succession of the significant codes E's, the particular code Vo*, and a run length code L (the argument omitted). It will readily be possible for one skilled in the art to select such a particular code in consideration of distribution of various code patterns of other codes, namely, the mode code Vo, the significant codes E's for various amplitudes, and the run length codes L's for various run lengths including a zero run length. When such a particular code is used, the mode code Vo may be a code that merely represents a single signal element of the zero amplitude. The mode code Vo may therefore be a run length code L(1) for the unit run length. Conversely, the fifteenth signal element S15 of the second cluster may be encoded into the mode code Vo under the circumstances.

According to above description, the code sequence comprises codes L(n), E, E, Vo*, L(4), E, E, L(1) or Vo, E, Vo*, and L(n') with undetermined values at the fifth and the seventh time instants. The buffer memory 29 produces the compression encoded signal sequence ignoring the undetermined time instants.

In the manner which will become clear as the description proceeds, it is possible to do without the particular code Vo*. In this case, the mode code Vo should be a specific code by which it is easy to discriminate between a fundamental series of a run length code L, the specific code, and a succession of significant codes E's and a subsidiary series in which a run length code L is next succeeded by a succession of significant codes E's without the specific code interposed. Furthermore, the run length codes L's should be distinguished from the significant codes E's so as to be decoded without application of the second mode of operation in the manner which will later be described in detail and in a more exact expression. The mode code Vo may indicate switching of the two modes from the first mode to the second mode in cooperation with a next preceding run length code L and a next succeeding significant code E.

Figure 3:
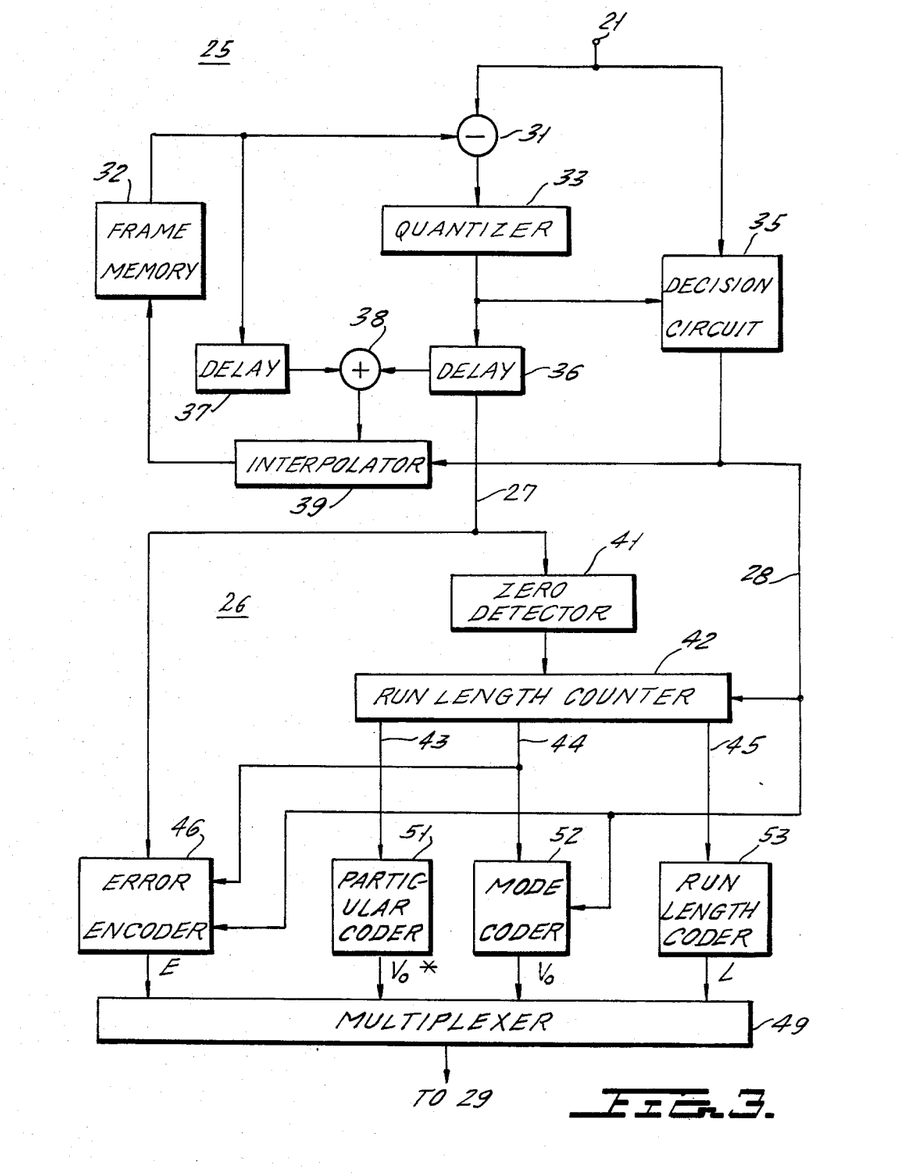
FIG. 3 is a block diagram of a principal part of an encoding circuit according to an embodiment of this invention.

Referring to FIG. 3, the preliminary and the main encoding devices 25 and 26 will be described greater in detail. The encoding devices 25 and 26 are for use in an encoding circuit wherein a subsampling process is used in accordance with a single predetermined rule as a compression encoding scheme. It will be presumed that the preliminary encoding device 25 is operable in compliance with the predictive encoding. It will furthermore be presumed that the original signal sequence is a picture signal which comprises frames at a frame period and that each frame comprises a predetermined number of subsequences at a subsequence period.

The picture signal is delivered through the circuit input terminal 21 to a subtractor 31 which successively produces prediction errors by calculating differences from time to time between the picture signal and a prediction signal. In the manner known in the art, the prediction signal is supplied to the subtractor 31 from a frame memory 32 which will presently be described. The prediction errors are quantized by a quantizer 33 into quantized errors. Each quantized error produces either a significant or an insignificant signal element.

The picture signal is furthermore delivered to a decision circuit 35 to which the quantized errors are also supplied. The decision circuit 35 is for discriminating those parts of the picture signal from other parts in which the quantized errors are not constantly zero errors but are conveniently encoded with application of the subsampling process. The decision circuit 35 thereby supplies the control connection 28 with a mode signal which selectively indicates a plurality of modes, such as two modes of application and non-application of the subsampline process, with the two modes switched between a first and a second mode depending on applicability and non-applicability of the subsampling process to those of the quantized errors which are finite or significant errors other than the zero errors.

It will be understood from the above description that the zero errors provide runs of insignificant or background signal elements and that the finite errors provide clusters of significant or information bearing signal elements. In the example being illustrated with reference to FIG. 2, the two modes are switched from the first mode to the second mode next preceding each cluster of the significant signal elements which should be encoded with application of the subsampling process and from the second mode to the first mode whenever the cluster in question comes to an end. The two modes are kept at the first mode in response to each cluster of the significant signal elements which should be encoded without the subsampling process. At any rate, the decision circuit 35 produces the mode signal with a delay of about one subsequence period. The delay is necessary in forming the clusters and in locating the clusters which should be encoded with application of the subsampling process. The decision circuit 35 will not be described more in detail because it will readily be possible for one skilled in the art to implement such a circuit.

The quantized errors are delivered furthermore to a first delay circuit 36 which produces a first delayed signal with the quantized errors given the delay of the decision circuit 35. The prediction signal is supplied to a second delay circuit 37 which produces a second delayed signal again with the delay of the decision circuit 35. The first delayed signal is delivered to the main connection 27 as the afore-described signal element sequence.

An adder 38 is for calculating a sum of the first and the second delayed signal to produce a primary local decoded signal comprising the insignificant signal elements and the remaining signal elements which will remain even after deletion of the redundant signal elements. Responsive to the mode signal supplied from the decision circuit 35 and the primary local decoded signal delivered from the adder 38, a linear or nonlinear interpolator 39 produces in compliance with the predetermined rule a secondary local decoded signal in which the primary local decoded signal is used without modification for the insignificant signal elements and the remaining signal elements and in which interpolation is carried out for the redundant signal elements which will later be deleted as the deleted signal elements.

The secondary local decoded signal is accumulated in the frame memory 32 of a memory capacity of about one frame and produced therefrom as the prediction signal. If the subtractor 31, the quantizer 33, and the adder 38 have no delay, a combination of the frame memory 32, the interpolator 39, and either of the first and the second delay circuits 36 and 37 has a delay which is equal to one frame period.

The main encoding device 26 comprises a zero or constant amplitude detector 41 which is supplied with the signal element sequence through the main connection 27 and detects the insignificant signal elements to produce a zero detection signal. Responsive to the zero detection signal, a run length counter 42 detects a beginning and an end of each run to supply beginning and end connections 43 and 44 with a beginning and an end signal indicative of the beginning and the end. The run length counter 42 is controlled by the mode signal through the control connection 28 and calculates the above-described adjusted run length of the run in question to supply a run length connection 45 with a run length signal representative of the adjusted run length.

An error encoder 46 is activated by the end signal and starts to encode the significant signal elements of each cluster in the signal elements supplied through the main connection 27. The error encoder 46 is controlled by the mode signal delivered through the control connection 28 and carries out the subsampling of the significant signal elements only when the mode signal indicates the second mode. The error encoder 46 thereby supplies a multiplexer 49 with successions of the significant codes E's in the manner depicted in FIG. 2 along the bottom line.

Responsive to the beginning signal, a particular coder 51 encodes that one of the insignificant signal elements into the particular code Vo* which stands at the beginning of each run. Controlled by the mode signal and responsive to the end signal, a mode coder 52 encodes and does not encode one insignificant signal element to the mode code Vo that appears at the end of each run to next precede a cluster of the significant signal elements which should be encoded with and without application of the subsampling respectively. Responsive to the run length signal, a run length coder 53 encodes the adjusted run length into the run length code L.

The particular code Vo*, the mode code Vo, and the run length code L are multiplexed by the multiplexer 49 together with the significant codes E's into the code sequence, which is delivered to the buffer memory 29. It will be understood that a combination of the run length counter 42 and the run length coder 53 serves as a run length encoding arrangement for encoding each run into a run length code L representative of a run length dependent on the actual run length of the run being encoded.

On the other hand, the particular coder 51 encodes that one insignificant signal element into the particular code Vo* which stands at the beginning of each run next preceded by a cluster of the significant signal elements encoded irrespective of application and non-application of the subsampling. The run length encoding arrangement is coupled to the particular coder 51 to produce the run length code L always starting with the particular code Vo*. The run length encoding arrangement is coupled to the mode coder 52 and the particular coder 51 to produce the run length code L with the run length code L made to represent those first and second adjusted run lengths when the mode code Vo is produced and not produced, respectively, which are one and two signal elements shorter than the actual run length in the manner described before, respectively.

Figure 4:
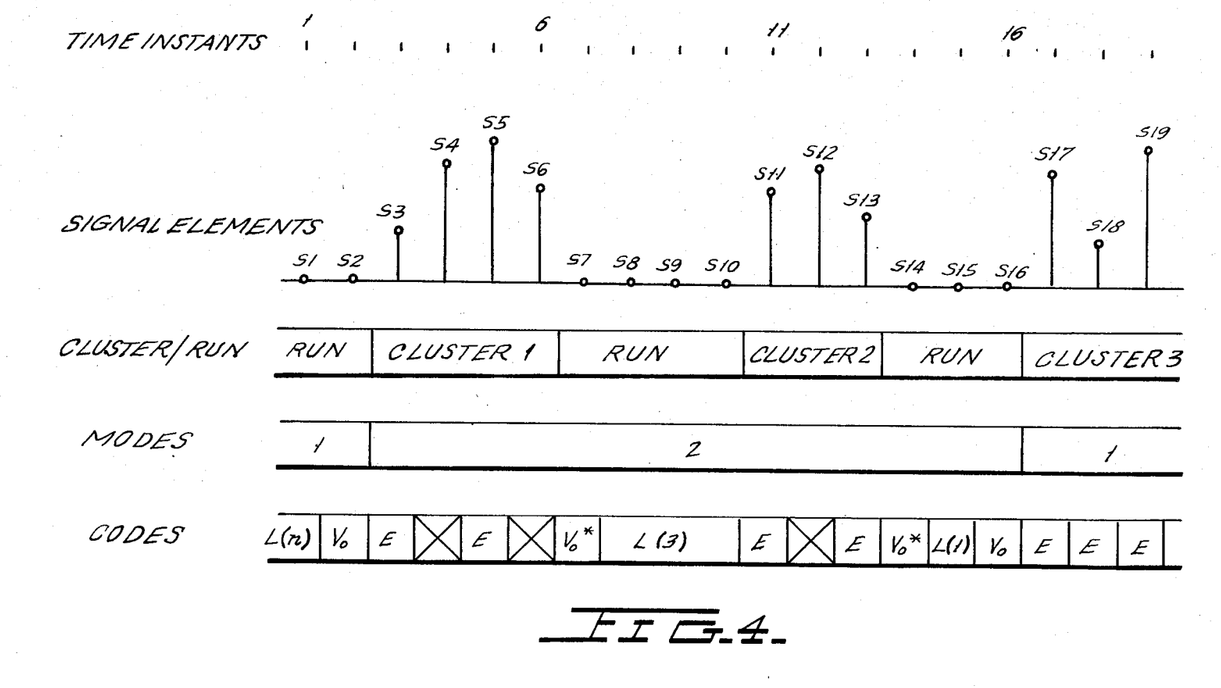
FIG. 4 is a schematic time chart for use in describing operation of an encoding and a decoding circuit according to another aspect of this invention.

Referring now to FIG. 4, the time instants or sampling instants and the signal elements or samples are depicted like in FIG. 2 along a top or first and a second line, respectively. The first and the second signal elements S1 and S2, the seventh through the tenth signal elements S7 to S10, and the fourteenth through the sixteenth signal elements S14 to S16 are insignificant or background signal elements. The third through the sixth and the eleventh through the thirteenth signal elements S3 to S6 and S11 to S13 are significant or information signal elements which can be encoded with application of the subsampling process. The seventeenth through the nineteenth signal elements S17 to S19 are significant signal elements which have irregularly varying amplitudes and which should be encoded preferably without application of the subsampling. In the manner illustrated along a third line labelled "Cluster/Run," the signal element sequence comprises first through third clusters with runs interposed.

From a different point of view, the signal element sequence comprises a first partial sequence comprising, in turn, a cluster and a run next succeeding the cluster wherein the cluster consists of significant signal elements which can be encoded with application of the subsampling. A second partial sequence likewise comprises a cluster and a run next succeeding the cluster wherein the last-mentioned cluster consists of significant signal elements which should be encoded with application of the subsampling. In the example being illustrated, the first partial sequence comprises the first and the second clusters and the runs which next succeed the respective clusters. The second partial sequence comprises the third cluster and a run which is not depicted but would next succeed the third cluster. It will be assumed that the run comprising the first and the second signal elements S1 and S2, next succeeds a cluster which is not shown but consists of significant signal elements encoded without application of the subsampling. The run in question therefore belongs to another second partial sequence.

In the manner illustrated along a fourth line labelled "Modes," the mode signal selectively indicates a plurality of modes, such as two modes of operation. As before, either the subsampling process or a like compression encoding scheme is not and is applied in the first and the second modes, respectively. The two modes are switched from the first mode to the second mode next preceding each first partial sequence and from the second mode to the first mode before each second partial sequence. Switching from the second mode to the first mode is, however, depicted at an interface between the first and the second partial sequences. It should be noted that each run should never be subjected to the compression encoding scheme even if the run is included in the first partial sequence.

Directing attention to a fifth or bottom line labelled "Codes," the significant code E, the mode code Vo, and the run length code L are used as before. The particular code Vo*, however, need not indicate switching of the two modes from the second mode to the first mode and is different in this respect from the particular code Vo* described in conjunction with FIG. 2. In FIG. 4, the particular code Vo* merely indicates a transition from a cluster to a next succeeding run and facilitates detection of the mode code Vo on decoding the code sequence. It is therefore possible to dispense with the particular code Vo* and to make the run length code L represent the actual run length for a run interposed between two clusters subjected to one of the two modes and that adjusted run length for a run interposed between two clusters subjected to different modes which is always equal to the actual run length less one signal element.

Each mode code Vo alternately indicates the two modes for the respective partial sequences. More particularly, each mode code Vo indicates switching of the two modes either from the first mode to the second mode or from the second mode to the first mode in the sense described above.

Attention should be directed in this connection to the fact that the signal element sequence very often comprises a plurality of subsequences which are typically scanning lines mentioned heretobefore. Each subsequence comprises a succession of partial sequences which may no more be classified into the first and the second partial sequences. It is permitted to assume without loss of generality that each subsequence starts either with a run or with a cluster which is subjected to the first mode of operation irrespective of applicability of the compression encoding scheme to the significant signal elements thereof. The first mode is therefore switched to the second mode upon first appearance of the mode code Vo in each subsequence or when the mode code Vo appears in each subsequence an odd number of times. The second mode is switched to the first mode whenever the mode code Vo appears in each subsequence an even number of times.

Stated otherwise; it is possible under the circumstances to assign natural numbers starting with one to the partial sequences in each subsequence, respectively. Each partial sequence assigned with the natural number except one, starts with a cluster. The partial sequence numbered one, starts either with a run or with a cluster of the significant signal elements which should be encoded without application of the compression encoding scheme. The mode code Vo next precedes each partial sequence. The two modes are switched from the first mode to the second mode in response to the mode code Vo next preceding each partial sequence assigned with an even number and from the second mode to the first mode in response to the mode code Vo for each partial sequence given an odd number. Incidentally, it will be understood that the partial sequences are numbered merely for identification and may equivalently be specified.

The main encoding device 26 (FIGS. 1 and 3) is controlled by the mode signal in the manner which is similar to that described in connection with FIG. 2. Each mode code Vo is, however, derived from that one of the insignificant signal element of a run which next precedes each partial sequence. In contrast to the twelfth signal element S12 next preceding in FIG. 2 the second cluster and not encoded into the mode code Vo because the second cluster consists of significant signal elements which should be encoded without application of the compression encoding scheme, the sixteenth signal element S16 is encoded into the mode code Vo despite the fact that the insignificant signal element next precedes the third cluster of the significant signal elements which should be encoded also without application of the compression encoding scheme.

Reviewing FIGS. 1 and 3 in consideration of FIG. 4, the preliminary encoding device 25 is operable in the manner which is not materially different from the operation described before. The decision circuit 35 alone should be modified so as to produce the mode signal with the two modes switched from one to the other only when a variation occurs in the significant signal elements (the finite errors) between the clusters in two consecutive ones of the partial sequences in each subsequence. The main encoding device 26 is well operable without modification insofar as the particular code Vo* is used. When the particular code Vo* is not used, the particular coder 51 becomes unnecessary. The run length counter 42 need not detect the beginning of each run and should be controlled by the mode signal so as to supply the run length connection 45 with the adjusted and the actual run lengths when the mode signal indicates and does not indicate switching between the two modes, respectively.

Reviewing FIGS. 2 and 4, it is possible to encode that one of the insignificant signal elements in a different manner into the mode code Vo which next precedes each cluster irrespective of applicablilty and non-applicability of the compression encoding scheme to the significant signal elements thereof. Each mode code Vo should indicate one of the above-mentioned plurality of modes that should be applied to the significant signal elements of the cluster next succeeding the mode code Vo in question. One signal element is, however, not reduced from the run length according to the different manner even if the insignificant signal element is encoded into the mode code Vo.

More specifically speaking of the different manner of operation with reference to FIG. 4, each of the second, the tenth, and the sixteenth signal elements S2, S10, and S16 is encoded into the mode code Vo. In other words, the mode code Vo is additionally included in the code sequence next preceding each cluster and next precedes even the second cluster which should be encoded without a change in the two modes from the mode applied to the first cluster. The run between the first and the second clusters is encoded into a particular code Vo* and a run length code L(5). The run between the second and the third clusters is encoded into a particular code Vo* and a run length code L(2). In FIG. 2, the mode code Vo is additionally used at the twelfth time instant next preceding the second cluster which should be encoded in the first mode. The run between the first and the second clusters is encoded into a particular code Vo* and a run length code L(4) even though the twelfth signal element S12 is also encoded into the mode code Vo.

In FIG. 3, the run length encoding arrangement is coupled to the mode coder 52 to produce the run length code L always next succeeded by the mode code Vo. Despite addition of the mode codes Vo's, the amount of information is not unduly increased in the code sequence when the particular code Vo* is used. This is because it is possible to use a one-bit code as the mode code Vo when the above-mentioned plurality of modes are two in number. The one-bit code is used as a first and a second one-bit code indicative of the first and the second modes, respectively.

The examples of operation illustrated with reference to FIGS. 2 and 4, will be referred to for brevity of description as operations according to a first and a second aspect of this invention, respectively. The different manner of operation described with a review to FIGS. 2 and 4, will be called an operation according to a third aspect of this invention.

Again referring to FIG. 3, the error encoder 46 is controlled by the mode signal so as to encode the clusters selectively in the first and the second modes in the manner described in the preamble of the instant specification and elsewhere. In contrast, the decision circuit 35 leaves the runs out of consideration on switching the above-mentioned plurality of modes, such as two modes, between the first and the second modes. The run length coder 53 is not controlled by the mode signal which selectively indicates the first and the second modes. This shows the fact that the runs are always encoded without application of the compression encoding scheme in the manner described here and there. It is therefore convenient to understand that the runs are encoded in a zeroth mode of operation which is neither of the first and the second modes. Incidentally, the significant codes E's may be called amplitude codes depending on the circumstances even if the significant codes E's do not actually represent amplitudes of the respective remaining signal elements.

Referring back to FIG. 1, description will proceed to a decoding circuit for use as a counterpart of the encoding circuit. The decoding circuit has circuit input and output terminals 56 and 57. The input terminal 56 is supplied with the compression encoded signal sequence from the transmission or the recording medium 23. The decoding circuit supplies the output terminal 57 with an expansion decoded signal sequence as a reproduction of the original signal sequence or of the picture signal.

The decoding circuit comprises a buffer memory 59 for carrying out rate matching between the rate of use of the compression encoded signal sequence in the transmission or the recording medium 23 and a rate at which the compression encoded signal sequence is subjected in main and subsidiary decoding devices 61 and 62 selectively to an expansion decoding scheme corresponding to the compression encoding scheme used in the counterpart encoding circuit. The main and the subsidiary decoding devices 61 and 62 are so named for the reason pointed out in connection with the main encoding device 26. The expansion decoding scheme is and is not applied in a first and a second mode of operation of the decoding circuit, respectively. More particularly speaking of the second mode, the compression encoded signal sequence is decoded with addition of the information which is reduced by the compression encoding scheme. The predetermined rule for the compression encoding scheme should be used in a reversed manner as a reversed rule on carrying out the expansion decoding scheme.

The main decoding device 61 is supplied from the buffer memory 59 with the compression encoded signal sequence as a sequence of various codes which comprise successions of significant codes E's, run length codes L's, and a mode code Vo selectively interposed between one of the run length codes L's and one of the successions of significant codes E's. No quiescent time instant is present in the successions even if the subsampling process is used as the compression encoding scheme in the counterpart encoding circuit. It is preferred in the manner described before that the code sequence should further comprise a particular code Vo* which is next preceded by a significant code E of the successions and next succeeded by a run length code L, namely, which appears in each continuation of a significant code E of a preceding succession, the particular code Vo*, and a next succeeding run length code L.

In the manner which will later be described in detail, the significant codes E's are decoded into significant or information signal elements. A cluster of the significant signal elements is formed from each succession with the expansion decoding scheme selectively applied to the successions. The run length codes L's are decoded into insignificant or background signal elements. Each run length code L provides a provisional run having a provisional run length which is represented by the run length code L under consideration and which consists of at least zero insignificant signal element.

The main decoding device 61 detects the mode code Vo in each of the above-defined fundamental series to produce a mode signal which selectively indicates the above-mentioned plurality of modes, such as two modes, with the two modes switched between the first and the second modes depending on detection of the mode code Vo. The main decoding device 61 furthermore produces clusters of the significant signal elements and actual runs of the insignificant signal elements. The quiescent time instants are added to the clusters when the subsampling process is used as the compression encoding scheme in the counterpart encoding circuit. The actual run is formed from each provisional run in the manner which will later be described. Such clusters and runs are delivered to the subsidiary decoding device 62 through a main connection 63 as a succession of signal elements which will also be described later. The mode signal is delivered to the subsidiary decoding device 62 through a control connection 64. Responsive to the mode signal, the subsidiary decoding device 62 interpolates the afore-mentioned deleted signal elements at the respective quiescent time instants to supply the output terminal 57 with the expansion decoded signal.

Figure 5:
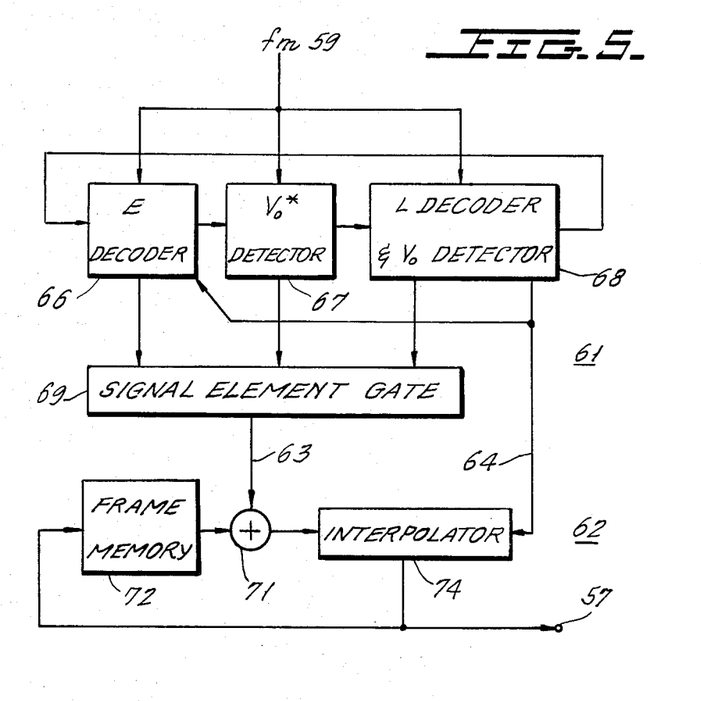
FIG. 5 is a block diagram of a principal part of a decoding circuit for use as a counterpart of the encoding circuit illustrated in FIG. 3.

Turning to FIG. 5, the main decoding device 61 comprises an error decoder (E decoder) 66 and a particular code detector (Vo* detector) 67 which are supplied with the sequence of various codes from the buffer memory 59. The code sequence is supplied also to a combination of run length decoder and mode code detetor (L decoder and Vo detector) 68 which will be referred to briefly as a run length decoder. Responsive to the code sequence, an assembly of the decoder and the detector 66 through 68 detects each continuation of a significant code E, a particular code Vo*, and a run length code L. Furthermore, the assembly discriminates between the fundamental and the subsidiary series.

More particularly, the particular code detector 67 detects the particular code Vo* in each continuation to produce a particular code detection signal whenever the particular code Vo* is detected. The particular code detector 67 suspends production of the particular code detection signal while the particular code Vo* is not detected. Every time when the particular code detection signal is produced, the particular code detector 67 enables the run length decoder 68. The particular code detection signal is delivered to a signal element gate 69 through a particular code connection.

The run length decoder 68 decodes each run length code L into a run length signal which lasts during the above-mentioned provisional run length represented by the run length code L under consideration. Furthermore, the run length decoder 68 detects the mode code Vo in each fundamental series to produce a mode code detection signal and to suspend production of the mode code detection signal whenever the mode code Vo is detected and while the mode code Vo is not detected, respectively. The run length decoder 68 thereby discriminates between the fundamental and the subsidiary series and enables the error decoder 66 upon completion of the discrimination, namely, either when the mode code detection signal is produced or when it is found that the run length code L is next succeeded by at least one significant code E. Being enabled by the particular code detection signal when the particular code Vo* is used in the code sequence, the run length decoder 68 detects the mode code Vo with reference to the particular code detection signal. The run length signal and the mode code detection signal are successively delivered to the signal element gate 69 through a run length and mode code connection.

The run length decoder 68 moreover produces the mode signal with the above-mentioned plurality of modes, such as two modes, switched between the first and the second modes depending on production of the mode code detection signal in the manner which will be described in the following. The mode signal is delivered to the control connection 64 and is used in controlling the error decoder 66 in the manner which will later be described.

According to the first aspect of this invention, the afore-defined fundamental series of a run length code L, the mode code Vo, and a significant code E in a succession of the significant codes E's indicates that the succession should be decoded into a cluster of significant signal elements in the second mode, namely, with application of the expansion decoding scheme. The subsidiary series in which the run length code L is next succeeded by a significant code E of a succession, indicates that the succession should be decoded into a cluster in the first mode, namely, without application of the expansion decoding scheme. The first mode is switched to the second mode upon detection of the mode code Vo, namely, upon production of the mode code detection signal. When the particular code Vo* is used, the second mode is switched to the first mode (or to the zeroth mode) when the particular code detection signal is produced next succeeding a significant code succession which is decoded in the second mode. The run length decoder 68 which is operable in this manner, will briefly be described later.

According to the second aspect, the code sequence comprises a continuation of partial sequences which can be assigned with natural numbers starting with one, respectively, like the partial sequences of the signal element sequence used in the counterpart encoding circuit. The code sequence may alternatively comprises a plurality of subsequences each of which comprises, in turn, a like continuation of partial sequences assigned similarly with natural numbers.

Each partial sequence comprises a succession of significant codes E's and a next succeeding run length code L. Like in the signal element sequence for the encoding circuit, each partial sequence starts with a significant code succession when assigned with the number except one. The partial sequence numbered one in each subsequence, starts either with a run length code L or with a significant code succession which should be decoded without application of the expansion decoding scheme. This equally applies even if the code sequence is not divisible into subsequences.

The mode code Vo next succeeds a run length code L at an end of a partial sequence and next precedes a significant code succession which stands first in a next succeeding partial sequence. The fundamental series is therefore included in two consecutive partial sequences. The subsidiary series is always included in a single partial sequence.

The fundamental series indicates that the significant code succession or successions in a partial sequence should be decoded in a mode different from the mode in which the significant codes E's are decoded in a next preceding partial sequence. The subsidiary series indicates that the significant codes E's in a partial sequence should be decoded without a change in the mode. The particular code Vo*, when used, always indicates that a run length code L next succeeds and that the run length code L should be decoded in the first (or the zeroth) mode.

The mode code Vo therefore alternately indicates, either singly or in a fundamental series, switching of the two modes into the first and the second modes. More specifically, the mode code Vo indicates switching from the first mode to the second mode when the mode code Vo next procedes an even-numbered partial sequence, namely, when the fundamental series for the mode code Vo under consideration, is included in two consecutive partial sequences which are assigned with an odd and an even number, respectively. The mode code Vo indicates switching from the second mode to the first mode when the mode code Vo in question is next succeeded by an odd-numbered partial sequence, namely, when the fundamental series is included in two consecutive partial sequences which are assigned with an even and an odd number, respectively. As regards the second aspect, the run length decoder 68 will later be described in detail.

According to the third aspect, the above-described subsidiary series never appears. Instead, the mode code Vo is always interposed between a significant code succession and a run length code L. When a one-bit code is used as the mode code Vo, the above-mentioned first and second one-bit codes indicate switching into the first and the second modes, respectively.

The particular code Vo* may not necessarily be used in the code sequence in the manner described before. Even in the absence of the particular code Vo*, each run length code L is decoded automatically in the first (or the zeroth) mode without application of the expansion decoding scheme. This is because the error decoder 66 and the run length decoder 68 are and are not controlled by the mode signal, respectively, like the error encoder 46 and the run length coder 53 described in conjunction with FIG. 3.

The error decoder 66 successively decodes the significant codes E's into significant signal elements of amplitudes which are represented by the respective significant codes E's. The error decoder 66 enables the particular code detector 67 when each succession of the significant codes E's comes to an end and is next succeeded by a particular code Vo*. When the particular code Vo* is not used, the error decoder 66 directly enables the run length decoder 68 when the significant code succession comes to an end and next succeeded by a run length code L.

The error decoder 66 is controlled by the mode signal. When the mode signal indicates the first mode, the significant signal elements are delivered to the signal element gate 69 through a significant signal element connection as a cluster in which no quiescent time instant is interposed. When the mode signal indicates the second mode, the significant signal elements are delivered to the signal element gate 69 as a cluster in which the quiescent time instants are interposed in compliance with the above-mentioned reversed rule.

The signal element gate 69 is successively supplied with a cluster, the particular code detection signal, the run length signal, and the mode code detection signal. Responsive to the particular code detection signal, the run length signal, and the mode code detection signal, the signal element gate 69 produces the above-mentioned actual run length by producing zero or at least one insignificant signal element in accordance with the provisional run length represented by the run length signal, a single insignificant signal element in response to the mode code detection signal, and an additional insignificant signal element in response to the particular code detection signal. Such clusters and runs are delivered to the main connection 63 as a succession of signal elements including the quiescent time instants at the respective time instants of the above-mentioned deleted signal elements. In other respects, the signal element succession is similar to the signal element sequence exemplified in FIG. 2 or 4 along the second line and comprises the afore-mentioned zero errors and those remaining errors which correspond to the remaining signal elements described in connection with the decision circuit 35 (FIG. 3).

It should be noted that no quiescent time instant is interposed in the runs because not only the run length decoder 68 but also the signal element gate 69 are not controlled by the mode signal which may indicate the second mode. On the other hand, the error decoder 66 is controlled by the mode signal and carries out the interposition as a part of the expansion decoding scheme when the mode signal indicates the second mode.

The subsidiary decoding device 62 comprises an adder 71 which is supplied with the signal element succession through the main connection 63 and to which a prediction signal is supplied from a frame memory 72. The adder 71 thereby delivers a primary decoded signal to an interpolator 74 which is controlled by the mode signal delivered through the control connection 64. The interpolator 74 corresponds to the interpolator 39 (FIG. 3) and interpolates the deleted signal elements at the respective quiescent time instants to produce a secondary decoded signal. The frame memory 72 accumulates the secondary decoded signal and produces the prediction signal. The interpolator 74 carries out the interpolation as a remaining part of the expansion decoding scheme.

If the adder 71 has no delay, a combination of the frame memory 72 and the interpolator 74 has a delay of one frame period of the picture signal. After such a delay, the interpolator 74 supplies the circuit output terminal 57 with the expansion decoded signal.

It is not understood that part of the run length decoder 68 serves as a detecting arrangement responsive to the code sequence for detecting the mode code Vo to produce the mode code detection signal and the mode signal. A combination of the error decoder 66 and the interpolator 74 serves as a first decoding arrangement coupled to the detecting arrangement for decoding each succession of the significant codes E's into a cluster of significant signal element without and with application of the expansion decoding scheme when the mode signal indicates the first and the second modes, respectively. Another combination of the run length decoder 68 and the signal element gate 69 serves as a second decoding arrangement for decoding each run length code L into a run of a provisional run length dependent on the run length code L in question. The run length and mode code connection is supplied with the mode code detection signal and coupled to the signal element gate 69 and serves as an adding arrangement for the single insignificant signal element. When the particular code detection signal is produced, the particular code connection serves as an additional arrangement for the additional insignificant signal element. It should furthermore be understood that the decoding circuit can decode the compression encoded signal into the expansion decoded signal successively in the order of the codes arranged in the compression encoded signal and that those codes are conveniently used in indicating application and non-application of a compression encoding and an expansion decoding scheme which are used in representing the insignificant signal elements.

Figure 6:
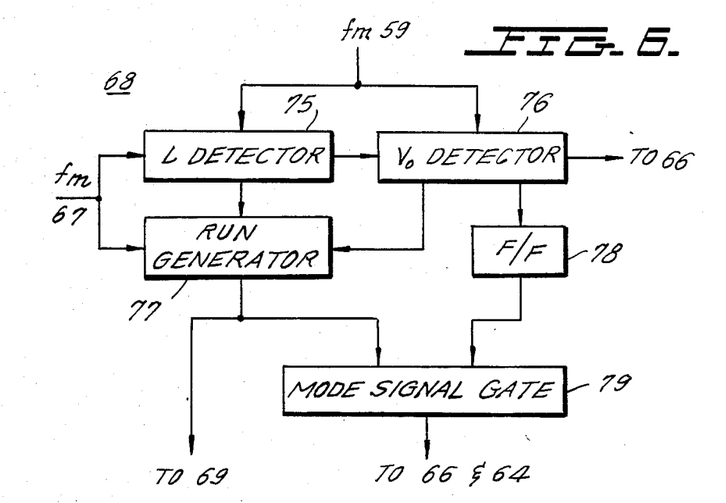
FIG. 6 is a block diagram of a run length decoder which is preferably used in the decoding circuit mentioned in conjunction wth FIG. 4.

Referring finally to FIG. 6, the combination of run length decoder and mode code detector 68 is for use in a decoding circuit operable according to the second aspect of this invention. The code sequence is supplied from the buffer memory 59 (FIG. 1) to a run length detector (L detector) 75 and a mode code detector (Vo detector) 76. The run length detector 75 is enabled by the particular code detector 67 (FIG. 5) together with a run generator 77. The run length detector 75, although so named, decodes the run length code L into the provisional run length and enables the mode code detector 76. Based on the decoded provisional run length, the run generator 77 supplies the signal element gate 69 (FIG. 5) with zero or at least one insignificant signal element. On the other hand, the mode detector 76 is enabled to detect whether or not the mode code Vo next succeeds the run length code L. Irrespective of detection of the mode code Vo, the mode code detector 76 enables the error decoder 66 (FIG. 5). Upon detection of the mode code Vo, the mode code detector 76 makes the run generator 77 add a single insignificant signal element to the zero or at least one insignificant signal element. It will be understood that the signal element gate 69 is equivalently supplied with the run length signal and the mode code detection signal.

A flip-flop 78 has two states and is preset at the beginning of each subsequence to a first state which indicates the first mode. The mode code detector 76 delivers the mode code detection signal to the flip-flop 78. Responsive to the mode code detection signal first produced during each subsequence period, the first state is switched to a second state indicative of the second mode. Thereafter, the two states are alternately switched to the first and the second modes every time when the mode code detection signal is produced. The flip-flop 78 therefore produces the mode signal. Alternatively, the flip-flop 78 delivers a logic zero and a logic one signal to a mode signal gate 79 when set in the first and the second states, respectively. The run generator 77 delivers the insignificant signal elements to the mode signal gate 79 as another logic zero signal. Under the circumstances, the mode signal gate 79 is an AND gate and produces the mode signal which is logic one only during time intervals illustrated in FIG. 4 along the third line labelled "Cluster/Run" for the first and the second clusters.

For use as the combination of run length decoder and mode code detector 68 operable according to the first aspect of this invention, the flip-flop 78 is preset to the first state at the beginning as before. The second state is switched back to the first state by the signal which enables the combination of the run length decoder and mode code detector 68. The first state is kept untouched when the combination 68 is enabled in the meantime. For the third aspect, it is preferred that the mode code detector 76 should put the flip-flop 78 into the first and the second states in response to the first and the second one-bit codes, respectively.

While this invention has thus far been described in conjunction with preferred embodiments operable according to various aspects of this invention, it will now readily be possible for one skilled in the art to carry this invention into practice in various other manners. For example, the encoding circuit may not only deal with a picture signal but also a sequence of various signal elements which comprise clusters of significant signal elements and runs of insignificant signal elements. Such signal elements need not to be quantized signal elements but may be, for example, picture elements per se. The preliminary encoding device 25 may encode the original signal sequence into such a signal element sequence according to the orthogonal transformation described in the above-cited Chen et al article. The compression encoding scheme may be use of a more coarse quantization step as compared with the step applied to the clusters for which it is preferred that the coarse quantization step is not used.

According to the above-described first and second aspects of this invention, the code sequence may additionally comprise the mode code Vo according to the third aspect. On the other hand, the first and the second aspects may be carried out by using the two mode codes by separately indicating the first and the second modes, respectively. One of the insignificant signal elements that next precedes each cluster, may be encoded only into the first or the second one-bit code Vo according to the third aspect with the run length code L made to always represent the afore-defined second run length. In any one of various aspects, the mode code Vo may indicate two or more compression encoding schemes.

What is claimed is:

1. An encoder for encoding an input sequence of signal elements organized in clusters and runs which alternatingly follow one another in said input sequence, said clusters being comprised of those of said signal elements which are deemed to be significant, said runs being comprised of those of said signal elements which are deemed to be insignificant in that they contain repetitive or redundant information, said significant elements associated with said clusters being selectively processable in accordance with a compression coding scheme, said encoder comprising:

mode signal producing means for producing a mode signal having a first mode for indicating that said significant signal elements of said clusters are not to be processed in accordance with said compression code scheme and a second mode for indicating that said significant elements are to be processed in accordance with said compression code scheme;

first encoding means responsive to said mode signal for replacing at least one of said insignificant signal elements contained in a respective one of said runs with said mode signal for indicating the processing to be applied to the significant elements in the cluster next following said respective run;

second encoding means coupled to said mode signal producing means for converting each given one of said clusters into a succession of significant codes produced in accordance with said compression coding scheme but only if a portion of said mode signal associated with said given cluster is in its said second mode; and third encoding means for generating for each of said runs a respective run length code which is indicative of the number of insignificant elements in said run being encoded.

2. An encoder as in claim 1, wherein said mode signal producing means comprises means for setting said first mode for any given cluster of said clusters which immediately follows a preceding one of said clusters having said second mode.

3. An encoder as claimed in claim 1, wherein said input sequence is comprised of a succession of partial sequences, each of said partial sequences including one of said clusters and one of said runs immediately following said one of said clusters, said mode signal producing means being effective for sequentially alternating the mode signal of each succeeding partial sequence whereby the mode signal associated with any given partial sequence differs from the mode signal associated with the next preceding mode signal.

4. An encoder as claimed in claim 1, wherein said input sequence comprises a plurality of subsequences, each subsequence including a succession of partial sequences which are identified by natural numbers starting with the number 1, respectively, each one of said partial sequences containing one of said clusters and one of said runs which immediately follows said one of said clusters, said partial sequence numbered 1 including a given one of said clusters and a given one of said runs with said given run preceding said given cluster and said given cluster containing those of said significant signal elements which should be encoded without application of said compression coding scheme, said mode signal producing means being effective for producing said mode signal for said partial sequences which are assigned a number other than said number 1 such that said mode signal associated with any given one of said partial sequences is switched from said first mode to said second mode next preceding each partial sequence assigned an even number and from said second mode to said first mode next preceding each partial sequence assigned an odd number.

5. An encoder as claimed in claim 1, further comprising:

fourth encoding means for encoding at least the first one of the insignificant signal elements in each one of said runs with a predetermined code when said at least first insignificant signal element follows one of said clusters;

said third encoding means being coupled to said fourth encoding means and being effective to produce said run length code such that said run length code is immediately preceded by said predetermined code, said predetermined code being distinguishable from a series of a succession of the significant codes, said predetermined code and said run length code indicating that each one of said runs following said codes is to be encoded without application of said compression encoding scheme.

6. An encoder as claimed in claim 1, wherein said first encoding means is operative for producing a specific code as said mode code, said specific code being distinguishable from a fundamental series of a run length code, a succession of the significant codes and a subsidiary series in which a run length code is immediately succeeded by a succession of the significant codes not having said specific code interposed therebetween.

7. An encoder as claimed in claim 5, wherein said first encoding means is for producing, as said mode code, a code representative of a single insignificant signal element.

8. An encoder as claimed in claim 7, wherein the code representative of a single insignificant signal element is a run length code representative of a unit run length.

9. An encoder as claimed in claim 7, each run having an actual run length of at least two insignificant signal elements, said third encoding means being coupled to said first and said fourth encoding means to produce the run length code with said run length code representing a first and a second adjusted run length depending on whether or not said mode code is produced, respectively, said first and said second adjusted run lengths being one and two insignificant signal elements shorter than said actual run length, respectively.

10. An encoder as claimed in claim 5, each run having a run length of at least one insignificant signal element, wherein:
said first encoding means is for producing, as said mode code, a first one-bit code indicative of said first mode and for additionally producing a second one-bit code indicative of said second mode in response to one of of the insignificant signal elements of said input sequence that next precedes each cluster of the significant signal elements which should be encoded without application of said compression encoding scheme;
said third encoding means being coupled to said first encoding means to produce the run length code always next succeeded by the one-bit code indicative of either of said first and said second modes with said run length code made to represent the run length.

11. A decoder for decoding an input sequence of codes which include significant codes, run length codes, and mode codes which mode codes are selectively interposed in said sequence of codes to denote whether or not said significant codes are to be decoded in accordance with a predetermined expansion decoding scheme, said sequence of codes being defined in relation to a sequence of signal elements which are aggregated into a plurality of alternatingly disposed clusters and runs, each of said run length codes defining the number of elements in a respective run and each of said significant codes being associated with signal elements in said clusters, said mode codes indicating whether or not said signal elements in said clusters have been encoded in accordance with a predetermined compression encoding code, said decoder comprising:
detecting means responsive to said input sequence for detecting said mode codes and for generating a mode signal having a first mode and a second mode to indicate, respectively, that said significant codes are not or are to be processed in accordance with said expansion decoding scheme;
first decoding means coupled to said detecting means for decoding each of said significant codes into a respective cluster containing significant signal elements in accordance with said expansion decoding scheme but only if a portion of said mode signal associated with said respective cluster is in its said second mode; and
second decoding means for decoding each run length code and for generating therefrom a respective run.

12. The decoder as claimed in claim 11, in which said mode codes are of the type wherein said mode codes are disposed in the sequence of said data element at a location which replaces a signal element of a respective run.

13. A decoder as in claim 12, wherein said mode code is omitted in relation to predetermined ones of said clusters which are to be decoded without said decoding scheme and wherein said detecting means is effective for producing said mode signal to switch said mode signal from said first mode to said second mode upon detection of said mode code in each fundamental series and maintaining said mode signal at said first mode upon detection of a subsidiary series of codes in which one of said run length codes is immediately followed by a significant code of said successions which does not contain said mode codes.

14. A decoder as claimed in claim 13, wherein said sequence of codes further comprises a predetermined code which is immediately preceded by said succession and immediately followed by a respective one of said run length codes;
said detecting means comprising:
first means responsive to said input sequence for detecting said predetermined code within the significant codes of a previous one of said successions, predetermined codes, and one of said run length codes, to produce, based on said detection, a predetermined code detection signal whenever said predetermined code is detected; and
. second means coupled to said first means for detecting said mode code in each one of a fundamental series based on said predetermined code detection signal and in a manner which is effective to produce said mode signal such that said mode signal is switched from said second mode to said first mode upon the presence of said predetermined code detection signal whenever said predetermined mode appears in a continuation which is preceded by one of said successions which is also decoded to require processing in accordance with said expansion decoding scheme, and so that said mode code is maintained at said first mode when said predetermined code detection signal is derived from a predetermined code located in a data sequence which is preceded by one of the successions which is decoded not to require said processing in accordance with said expansion decoding scheme.

15. A decoder as claimed in claim 11, in which said input sequence comprises a plurality of subsequences, each subsequence including a continuation of partial sequences which are identified by natural numbers starting with the number 1, respectively, each one of said partial sequences containing one of said clusters and one of said runs which immediately follows said one of said clusters, said partial sequence numbered 1 including a given one of said clusters and a given one of said runs with said given run preceding said given cluster and said given cluster containing those of said significant signal elements which should be decoded without application of said expansion decoding scheme, said detecting means being effective for producing said mode signal such that said mode signal is switched from said first mode to said second mode when said fundamental series is included in two consecutive ones of said partial sequences in any given subsequence which are assigned with an odd and an even number, respectively, and said mode code being switched form said second mode to said first mode when said fundamental series is included in said given consecutive ones of said partial sequences in each subsequence which are assigned an even and an odd number, respectively.

16. A decoder as claimed in claim 11, wherein said detecting means comprises:

first means responsive to said input sequence for detecting said mode code in each fundamental series to produce said mode code detection signal in repsonse to the presence of said mode code; and second means coupled to said first means for producing said mode signal having said first and second modes and such that said mode signal is switched between said first and second modes in dependence on the generation of said mode code detection signal;

said mode detection means comprising:

third decoding means for decoding each run length code and converting said code into a respective one of said runs with indicia to indicate that said run is not to be processed in accordance with said expansion decoding scheme; and adding means coupled to said first means and to said third decoding means for adding a single insignificant signal element to the elements in said run when said mode code detection signal is generated.

17. A decoder as claimed in claim 16, wherein said various codes further include a predetermined code which is embedded in said sequence between a preceding one of said succession and a following one of said run length codes;

said detecting means further comprising third means responsive to said input sequence for detecting said predetermined code within a block of a significant code of said successions, said predetermined code, and one of said run length codes, and to produce upon detection of said predetermined code a predetermined code detection signal whenever said predetermined code is detected;

said first means being coupled to said third means to detect said mode code in each fundamental series based upon said predetermined code detection signal;

said second decoding means further including additional means coupled to said third detecting means and to said third means for, in addition, adding and additional insignificant signal element to said run when said predetermined detection signal is present.

18. A decoder as claimed in claim 11, wherein said various codes further include a predetermined code which is embedded in said sequence between a preceding one of said successions and a following one of said run length codes;

said detecting means comprising first means responsive to said input sequence for detecting said predetermined code within a block of codes containing a significant code of said successions, said predetermined code, and one of said run length codes, and to produce, based on said predetermined code, a predetermined code detection signal whenever said predetermined code is detected; and second means coupled to said first means for detecting said mode code in each fundamental series with reference to said predetermined code detection signal and for producing said mode signal having said first and second modes such that said mode signal is switched between said first and said second mode in dependence on the detection of said mode code.

19. A detector as claimed in claim 18, wherein said second decoding means comprises third decoding means for decoding each run length code and converting said detected run length code into a respective one of said runs and with indicia to indicate that said run is not to be processed in accordance with said expansion decoding scheme; and additional means coupled to said first means and to said third decoding means for adding an additional insignificant signal element to said elements contained in said run when said predetermined code detection signal is present.

20. A decoder as claimed in claim 18, wherein said mode code is consistently interposed between a respective one of said run length codes and one of said succesions, said mode code further being in the form of one of a first and a second 1-bit code, said second means being effective for producing said mode signal such that said mode signal is switched from said first mode to said second mode and from said second mode to said first mode directly in response to the presence of said first 1-bit code and said second 1-bit code, respectively.

* * * * *